(12) United States Patent
Kholmovski et al.

(10) Patent No.: US 7,429,862 B2
(45) Date of Patent: Sep. 30, 2008

(54) PPA MRT METHOD AND APPARATUS WITH SCALED CONTRIBUTION OF K-SPACE DATA TO THE RECONSTRUCTED IMAGE

(75) Inventors: Evgueni G. Kholmovski, Salt Lake City, UT (US); Stephan Kannengiesser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 150 days.

(21) Appl. No.: 11/406,573

(22) Filed: Apr. 18, 2006

(65) Prior Publication Data

US 2007/0241751 A1  Oct. 18, 2007

(51) Int. Cl.
*G01V 3/00* (2006.01)
(52) U.S. Cl. .................. 324/310; 324/307; 324/309
(58) Field of Classification Search ......... 324/300–322; 600/407, 410, 411
See application file for complete search history.

(56) References Cited

U.S. PATENT DOCUMENTS

| | | | | |
|---|---|---|---|---|
| 6,841,998 | B1 | 1/2005 | Griswold | 324/309 |
| 7,061,651 | B2 * | 6/2006 | Ogino | 358/3.27 |
| 2003/0004408 | A1 * | 1/2003 | Zhu | 600/410 |
| 2003/0076099 | A1 * | 4/2003 | Hajnal et al. | 324/307 |
| 2005/0200351 | A1 * | 9/2005 | Shimizu | 324/207.15 |
| 2007/0182411 | A1 * | 8/2007 | Bammer et al. | 324/307 |
| 2007/0198203 | A1 * | 8/2007 | Kimura | 702/85 |
| 2007/0241751 | A1 * | 10/2007 | Kholmovski et al. | 324/307 |

OTHER PUBLICATIONS

"GARSE: Generalized Autocalibrating Reconstructions for Sensitivity Encoded MRI," Kholmovski et al., Proc. Intl. Soc. Mag. Reson. Med. 13 (2005), p. 2672.
"Generalized Autocalibrating Partially Parallel Acquisitions (GRAPPA)," Griswold et al., Magnetic Resonance in Medicine, vol. 47 (2002), pp. 1202-1210.

* cited by examiner

*Primary Examiner*—Brij Shrivastav
*Assistant Examiner*—Tiffany A Fetzner
(74) *Attorney, Agent, or Firm*—Schiff Hardin LLP

(57) ABSTRACT

In a PPA MRT method and apparatus, a selected region of k-space containing respective portions of some of the incomplete, measured data lines and respective portions of some of the complete, reconstructed data lines is designated. For each data line in the selected region, a level of the noise therein is identified. For each reconstructed, complete data line in the selected region, a scaling factor is calculated that is dependent on the noise level in that reconstructed, complete data line and the noise level in at least one neighboring incomplete, measured data line in the selected region. The scaling factor is then applied to the reconstructed, complete data line in question, so that the contribution of that line to the overall reconstructed image is adjusted according to the scaling factor. The scaling factor can be limited dependent on where the selected region is located in k-space.

16 Claims, 4 Drawing Sheets

● Measured lines
○ Lines generated by linear combination of measured lines (GRAPPA-reconstruction)

☐ Regions of k-space with same characteristics of damping algorithm (e.g., damping factor scaling A / limit $f_{min}$)

☐ Region of k-space for one processing step line 1
line 2
line 3
line 4 a) Find average energy $E_1$ of samples in lines 1 and 4
b) Find average energy $E_2$ of samples in line 2
c) Scaling factor $f = A \cdot (E_2 / E_1)^X$, e.g., $X = 1$, $A = 1$
d) Limit scaling factor to $f_{min}$ and scale amplitude of line 2
e) Repeat steps b) – d) for line 3 etc.

CHA: Variety of the channels = = signals of the component coils

▨ measured lines
▭ measured reference lines
▬ non-measured (omitted) lines
▨ GRAPPA reconstructed lines

- Measured lines
- Lines generated by linear combination of measured lines (GRAPPA-reconstruction)
- Regions of k-space with same characteristics of damping algorithm (e.g., damping factor scaling $A$ / limit $f_{min}$ )
- Region of k-space for one processing step

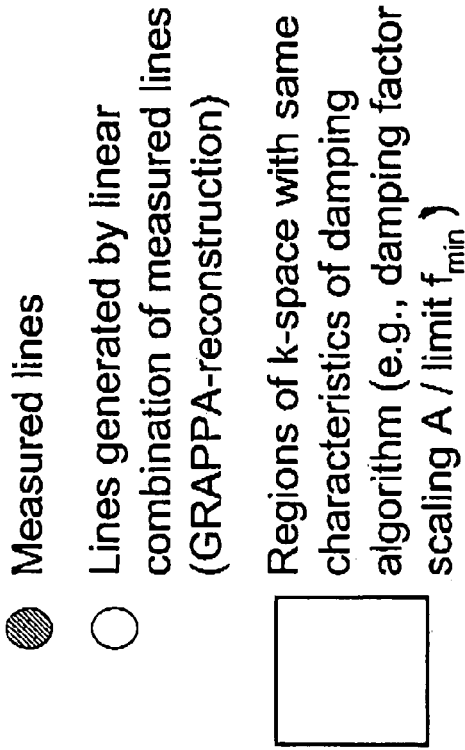

FIG. 5 a) Find average energy $E_1$ of samples in lines 1 and 4
b) Find average energy $E_2$ of samples in line 2
c) Scaling factor $f = A \cdot (E_2/E_1)^X$, e.g., $X=1, A=1$
d) Limit scaling factor to $f_{min}$ and scale amplitude of line 2
e) Repeat steps b) – d) for line 3 etc.

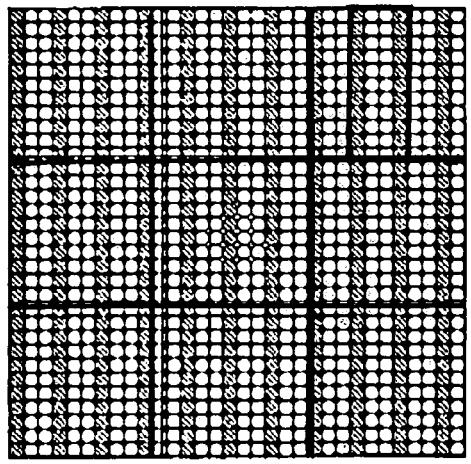

line 1
line 2
line 3
line 4

FIG. 6

PPA MRT METHOD AND APPARATUS WITH SCALED CONTRIBUTION OF K-SPACE DATA TO THE RECONSTRUCTED IMAGE

BACKGROUND OF THE INVENTION

1. Field of the Invention

The present invention generally concerns magnetic resonance tomography (MRT) as used in medicine for examination of patients. The present invention more specifically concerns a method as well as an MRT system for implementation of the method that employ image reconstruction based in partial parallel acquisition (PPA) of the raw data.

2. Description of the Prior Art

MRT is based on the physical phenomenon of magnetic resonance and has been successfully used as an imaging method for over 15 years in medicine and biophysics. In this examination modality, the subject is exposed to a strong, constant magnetic field. The nuclear spins of the atoms in the subject, which were previously randomly oriented, thereby align.

Radio-frequency energy can now excite these "ordered" nuclear spins to a specific oscillation. In MRT, this oscillation generates the actual measurement signal, which is acquired by suitable reception coils. By the use of inhomogeneous magnetic fields generated by gradient coils, the measurement subject can be spatially coded in all three spatial directions. This allows a free selection of the slice to be imaged, so slice images of the human body can be acquired in all directions. MRT as a tomographic image method in medical diagnostics is distinguished predominantly as a "non-invasive" examination method with a versatile contrast capability. Due to the excellent representation of the soft tissue, MRT has developed into a method superior in many ways to x-ray computed tomography (CT). MRT today is based on the application of spin echo and gradient echo sequences that enable an excellent image quality with measurement times in the range of seconds to minutes.

The continuous technical development of the components of MRT apparatuses and the introduction of faster imaging sequences are constantly making more fields of use in medicine amenable to MRT. Real-time imaging to support minimally-invasive surgery, functional imaging in neurology and perfusion measurement in cardiology are only a few examples. In spite of the technical progress in the construction of MRT apparatuses, acquisition time and signal-to-noise ratio (SNR) of an MRT image remain limiting factors for many applications of MRT in medical diagnostics.

Particularly in the case of functional imaging, in which a significant movement of the subject, or parts of the subject, is present (blood flow, heart movement, peristalsis of the abdomen etc.), a reduction of the measurement time (the data acquisition time) is desirable without loss of good SNR. Movement generally causes artifacts in an MRT image such as, for example, movement artifacts that increase with the duration of the data acquisition time. In order to improve the image quality, it would be conceivable to acquire multiple images and to later superimpose these. This does not always lead to an intended improvement of the total image quality, particularly with regard to the movement artifacts. For example, the SNR is improved while the movement artifacts accumulate.

One approach to shorten the measurement time while maintaining good SNR is to reduce the quantity of the acquired data. In order to acquire a complete image from such a reduced data set, either the missing data must be reconstructed with suitable algorithms or the flawed image from the reduced data must be corrected. The acquisition of the data in MRT occurs in what is known as k-space (spatial frequency domain). The MRT image in the image domain is linked with the MRT data in k-space by means of Fourier transformation. The spatial coding of the subject that spans k-space occurs by means of gradients in all three spatial directions. In the case of 2D imaging, differentiation is made among slice selection (establishes an acquisition slice in the subject, typically the z-axis), frequency coding (establishes a direction in the slice, typically the x-axis) and phase coding (determines the second dimension within the slice, typically the y-axis). These are achieved by respective magnetic field gradients. In the case of 3D imaging, the slice selection is replaced by a second phase coding direction. Without limitation as to generality, a two-dimensional Cartesian k-space is assumed herein that is sampled line-by-line. The data of a single k-space line are frequency-coded by means of a gradient upon readout. Each line in k-space has the interval $\Delta k_y$ that is generated by a phase coding step. Since the phase coding takes a great deal of time in comparison with the other spatial codings, methods (for example partial parallel acquisition, (PPA) have been developed that reduce the number of time-consuming phase coding steps, so as to shorten the image measurement time. The fundamental idea of PPA imaging is that the k-space data are not acquired by a single coil, but rather (as shown in FIG. 3A) by a (for example linear) arrangement of component coils (coil 1 through coil 3), namely a coil array. Each of the spatially-independent coils of the array carries certain spatial information which is used in order to achieve a complete spatial coding by a combination of the simultaneously-acquired coil data. This means that a number of other unsampled lines 32 (shown dotted in the following figures) that are displaced in k-space can be determined (i.e. reconstructed) from a single acquired k-space line 31 (shown in grey in the following figures). Such completed reconstructed data sets are shown in FIG. 3B for the case of three component coils.

The PPA methods thus use spatial information contained in the components of the coil arrangement in order to partially replace the time-consuming phase coding that is normally done using a phase coding gradient. The image measurement time is thereby reduced corresponding to the ratio of number of the lines of the reduced data set to the number of the lines of the conventional (thus completed) data set. In comparison to conventional data acquisition, in a typical PPA acquisition only a fraction (½, ⅓, ¼, etc.) of the phase coding lines are acquired. A special reconstruction is then applied to the data in order to reconstruct the missing k-space lines and thus to obtain the full field of view (FOV) image in a fraction of the time.

Different PPA methods respectively make use of different reconstruction techniques (normally an algebraic technique). The best known PPA methods are SENSE (sensitivity encoding) and GRAPPA (generalized auto-calibration PPA) with their respective derivatives. Such k-space based parallel image reconstruction, notably GRAPPA, may suffer image artifacts (partially resolved aliasing) and/or amplified image noise. A need exists to find a compromise between a residual image artifact level and the image noise level.

In conventional GRAPPA, strategies do not exist to control the balance between image artifacts and noise. The reconstruction coefficients are determined by solving an over-determined linear system of equations containing the calibration data. The system is usually solved by a least-squares technique.

SUMMARY OF THE INVENTION

It is an object of the present invention to provide a partial parallel acquisition magnetic resonance imaging method and apparatus wherein the aforementioned compromise between amplified noise and image artifacts is not only addressed, but also wherein noise contributions to the reconstructed image can be controlled or monitored, so that image artifacts resulting therefrom in the reconstructed image can be limited.

The above objects are achieved in accordance with the present invention in a PPA MRT method and apparatus wherein reconstructed data lines in k-space are analyzed as to noise level, and based on this analysis, a scaling factor is applied to the respective reconstructed data lines so that those data lines make a contribution to the reconstructed image that is dependent on their respective noise content.

Therefore, the amplitude of the reconstructed lines that are used for the overall image reconstruction is based on an estimate of the noise level thereof. In a preferred embodiment, the energy of groups of reconstructed and measured k-space samples in one or more k-space regions are compared, and the reconstructed samples are damped proportional to the ratio of the energies, or according to an exponential power of the ratio. Up to a certain damping factor, this will reduce the noise amplification while only slightly increasing the residual artifacts.

DESCRIPTION OF THE DRAWINGS

FIG. 5 schematically illustrates the basic principles for scaling the contribution of data lines in the reconstructed image, in accordance with the present invention.

FIG. 6 schematically illustrates a specific example of calculating a scaling factor in accordance with the invention.

DESCRIPTION OF THE PREFERRED EMBODIMENTS

Figure 1:
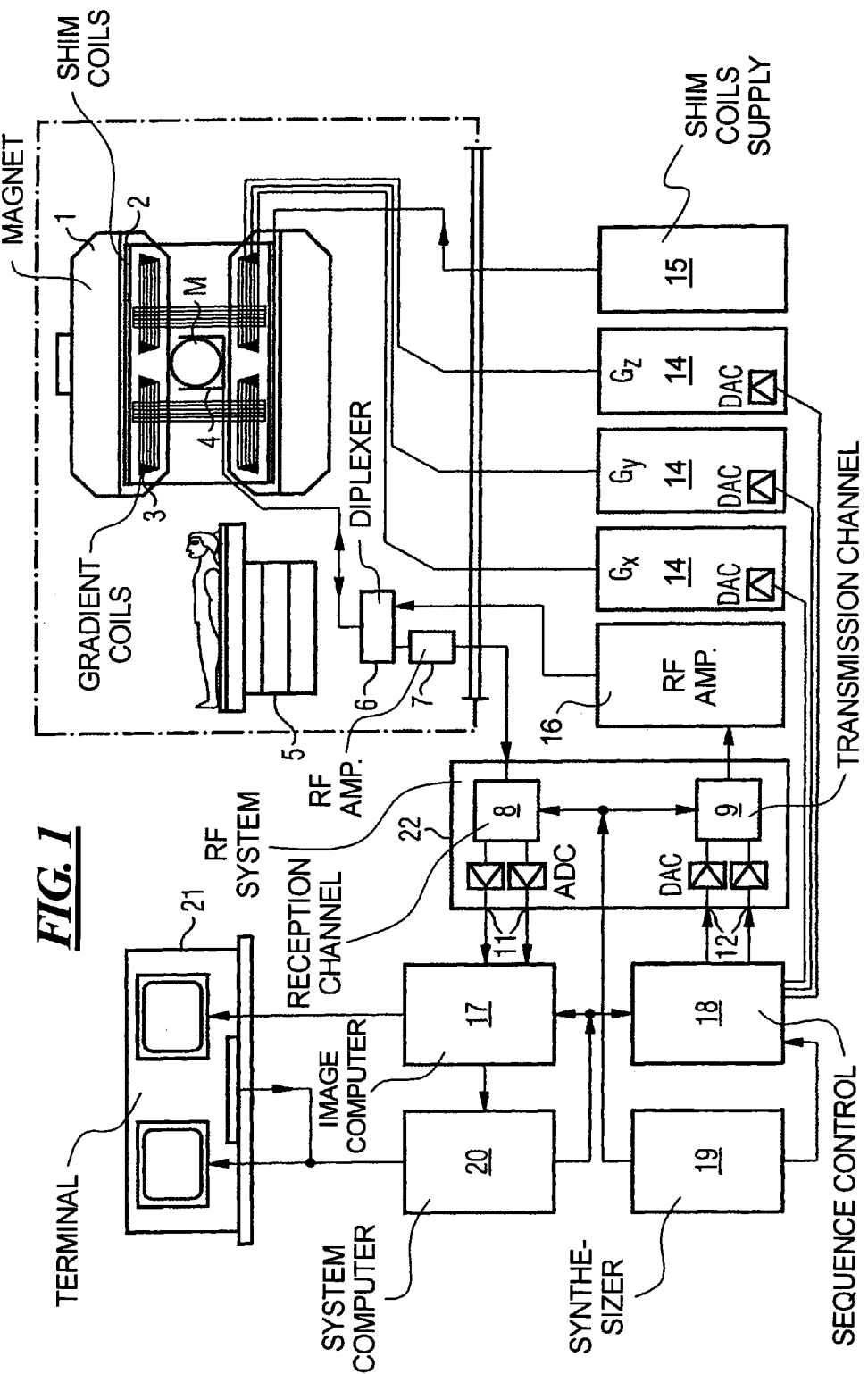
FIG. 1 is a schematic block diagram of an inventive MRT apparatus for implementation of the inventive method.
Figure 2:
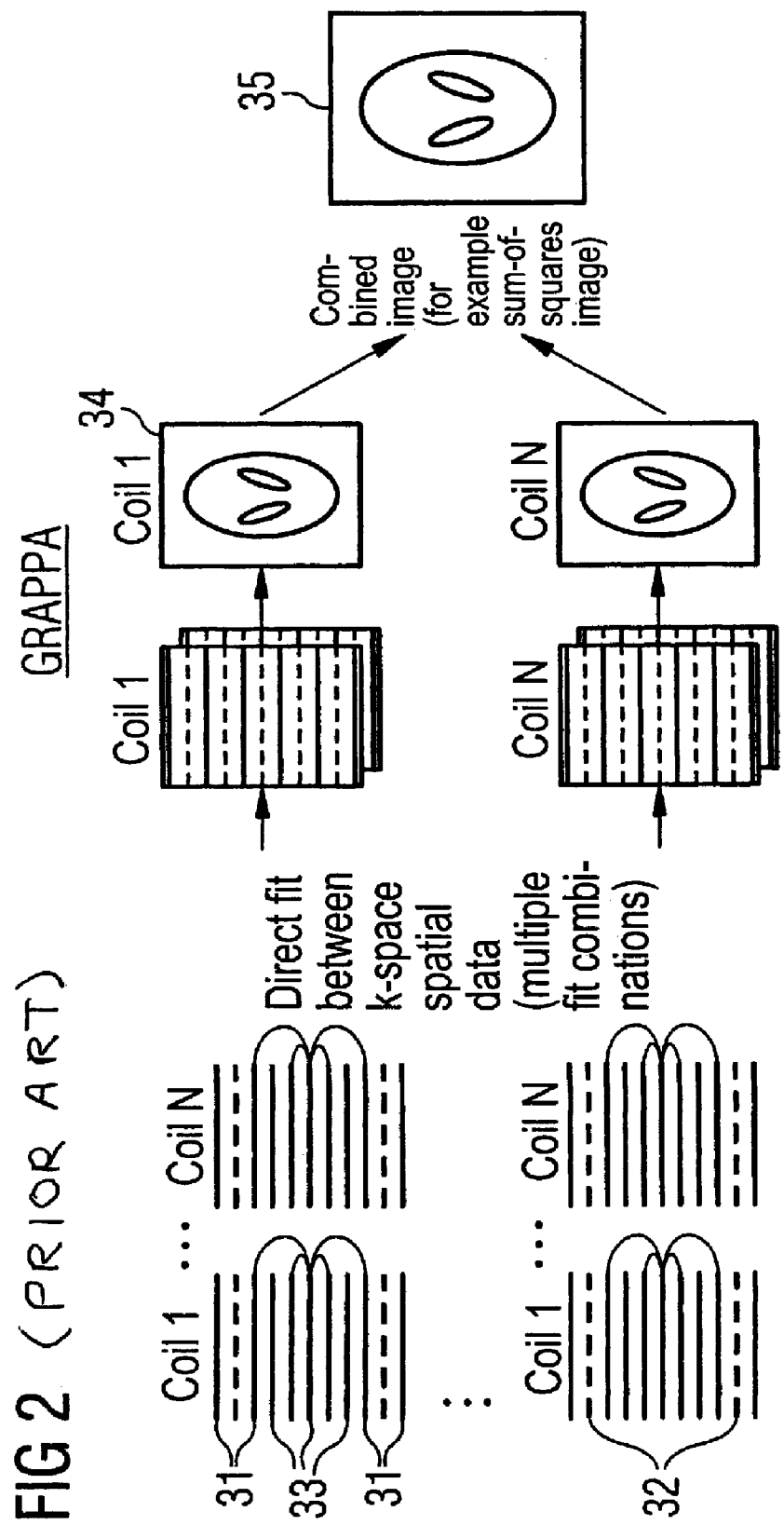
FIG. 2 schematically shows the basic procedure of image reconstruction according to GRAPPA.
Figure 3A:
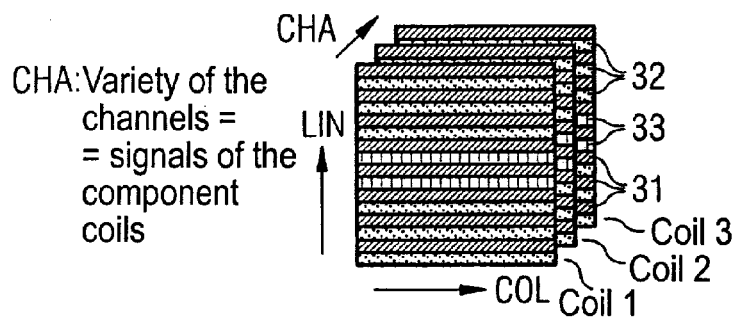
FIG. 3 shows the acquisition characteristic of the k-matrix in detail for three reduced data sets, including reference lines.
FIG. 3B shows the reconstructed (completed) data sets from FIG. 3A.
Figure 3B:
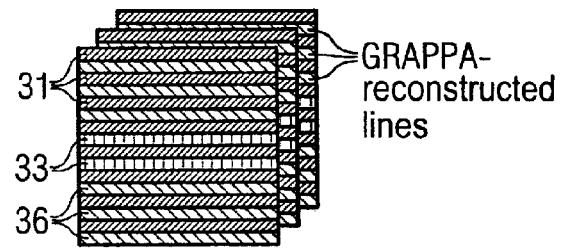

FIG. 1 is a schematic illustration of a magnetic resonance imaging or magnetic resonance tomography apparatus for generating a magnetic resonance image of a subject according to the present invention. The design of the magnetic resonance tomography apparatus thereby corresponds that of a conventional magnetic tomography apparatus, with the differences identified below. A basic field magnet 1 generates a temporally-constant strong magnetic field for polarization or alignment of the nuclear spins in the examination region of a subject such as, for example, of a part of a human body to be examined. The subject lies on a patient support 5. The high homogeneity of the basic magnetic field necessary for the magnetic resonance measurement is defined in a spherical measurement volume M in which the parts of the human body to be examined are introduced. To support the homogeneity requirements, and in particular for elimination of temporally invariable influences, shim plates made of ferromagnetic material are mounted at a suitable location. Temporally variable influences are eliminated by shim coils 2 that are activated by a shim power supply 15.

A gradient coil system 3 is composed of a number of windings (sub-windings) is disposed in the basic field magnet 1. Each sub-winding is supplied with current by an amplifier 14 for generation of a linear gradient field in the respective directions of the Cartesian coordinate system. The first sub-coil of the gradient coil system 3 thereby generates a gradient Gx in the x-direction, the second sub-coil generates a gradient Gy in the y-direction and the third sub-coil generates a gradient Gz in the z- direction. Each amplifier includes a digital-analog converter that is activated by a sequence controller 18 for time-accurate generation of gradient pulses.

Located within the gradient coil system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF reception coils in the form, for example, of a linear array of component coils in PPA imaging systems. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for excitation of the magnetic resonance. The respective radio-frequency pulses are thereby digitally represented in the sequence controller 18 as a series of complex numbers based on a pulse sequence predetermined by the system computer 20. The real and imaginary parts of this number series are respectively supplied via inputs 12 to a digital-analog converter in the radio-frequency system 22, and from this to a transmission channel 9. In the transmission channel 9, the pulse sequences are modulated with a radio-frequency carrier signal having a base frequency that corresponds to the resonance frequency of the nuclear spins in the measurement volume. The output of the transmission channel 9 is amplified in an RF amplifier 16 and supplied to a diplexer 6.

The switch-over from transmission to reception operation ensues via the transmission-reception diplexer 6. The RE transmission coil of the radio-frequency antenna 4 radiates the radio-frequency pulses for excitation of the nuclear spins into the measurement volume M for excitation of the nuclear spins and samples resulting echo signals via the RE reception coils. The correspondingly-acquired magnetic resonance signals are phase-sensitively demodulated in the reception channel 8 of the radio-frequency system 22 and translated into a real part and an imaginary part of the measurement signal that are emitted at outputs 11 of respective analog-digital converters. An image is reconstructed by an image computer 17 from the measurement data acquired in this manner. The administration of the measurement data, the image data and the control programs ensues via the system computer 20. Based on requirements set by control programs, the sequence controller 18 monitors the generation of the respective desired pulse sequences and the corresponding sampling of k-space. The sequence controller 18 in particular controls the time-accurate switching of the gradients, the emission of the radio-frequency pulses with defined phase and amplitude and the reception of the magnetic resonance signals. The time base for the radio-frequency system 22 and the sequence controller 18 is provided by a synthesizer 19. The selection of suitable control programs for generation of a magnetic resonance image as well as the representation of the generated magnetic resonance image ensues through a terminal (console) 21 that has a keyboard as well as one or more display screens.

Figure 4:
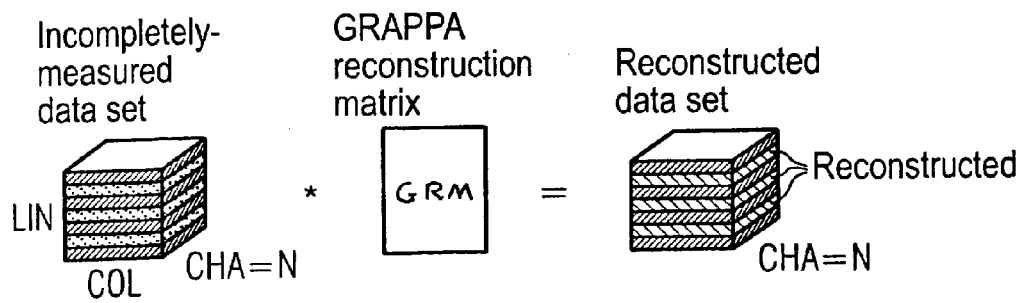
FIG. 4 schematically illustrates how a reconstructed data set is obtained from an incompletely measured data set in the conventional GRAPPA technique.

FIG. 4 schematically illustrates the basic steps for obtaining a reconstructed data set in accordance with conventional GRAPPA reconstruction. An incompletely measured data set obtained with N channels is shown organized according to LIN and COL axes. This incompletely measured data set is multiplied by a GRAPPA reconstruction matrix GRM, to obtain a reconstructed data set that contains reconstructed lines as indicated in FIG. 4. The reconstructed data set should not be confused with the reconstructed image, which is produced therefrom by Fourier transformation in a known manner.

FIG. 5 illustrates the basic procedure of the inventive method that is implemented by the inventive apparatus. FIG. 5 schematically illustrates samples in k-space by circles, with samples in incompletely measured lines being shaded, and samples for reconstructed lines (lines generated by linear combinations of measured lines in a GRAPPA reconstruction) being shown empty. As an example, k-space in FIG. 5 is divided into regions with the same, or approximately the same, characteristics for damping, i.e., regions for which the damping factor or scaling factor will be limited to the same extent. This is indicated by the fraction of A (which is an arbitrary multiplication factor) and the limit for $f_{min}$. Typically, $f_{min}$ will be approximately 0.75 near the center of k-space, and will be approximately 0.5 at the regions near the periphery, but may depend on the original noise level of the data set, an acceleration factor, or other information.

A region of k-space for one processing step is indicated by the rectangle at the lower right, and this serves the basis for the specific example shown in FIG. 6.

In general terms, in accordance with the invention, magnetic resonance data are acquired from a subject in each of a number of reception channels, resulting in electronically stored k-space data organized in a number of data lines. Each data line contains amplified noise. As schematically shown in FIG. 5, and as explained in the figures relating to conventional GRAPPA reconstruction, the data lines in k-space include incomplete, measured data lines and complete, reconstructed data lines. An image of the subject is electronically reconstructed from the k-space data for each channel, by Fourier transformation of the respective k-spaces.

In accordance with the present invention, a region, such as the rectangular region shown in FIG. 5, of k-space is selected that contains portions of some of the incomplete, measured data lines and portions of the some of the complete, reconstructed data lines. For each data line in the selected region, a level of the amplified noise therein is identified. For a selected reconstructed, complete data line in the selected region, a scaling factor is automatically electronically calculated that is dependent on the identified amplified noise level in the selected, reconstructed complete data line, and the amplified noise level in at least one neighboring incomplete, measured data line in the selected region. This scaling factor is then applied to the selected reconstructed, complete data line and scales the contribution thereof to the reconstructed image of the subject.

As noted above, the scaling factor (damping factor) can be limited dependent on where the selected region occurs in k-space. In the example shown in FIG. 5, k-space is divided into nine square regions, and the selected rectangular region happens to be in a peripheral region, in which case the damping factor will be limited to a greater extent than if the selected region had been in the center of k-space.

A specific example of the inventive method and apparatus is shown in FIG. 6. In this example, the average energy is used as the identification of the noise level. In a first step, the average energy $E_1$ of samples in lines 1 and 4 (incomplete, measured lines) is undertaken. The average energy $E_2$ is also found for the samples in line 2 (a reconstructed data line). A scaling factor $f=A \cdot (E_2/E_1)^x$ is then calculated. A and X can be selected dependent on many factors, and, in many instances, may both be equal to one. If appropriate, the scaling factor can then be limited to $f_{min}$, and the scaling factor f or the limited scaling factor $f_{min}$ is then used to scale the amplitude of line 2, which thus scales its contribution to the reconstructed image. These steps are then repeated for any other reconstructed line, such as line 3, in the selected region.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance (MR) partial parallel image reconstruction method, wherein MR data are acquired from a subject in each of a plurality of reception channels by a partial parallel acquisition (PPA) technique, resulting in electronically stored k-space data comprising: a plurality of PPA data lines, each containing noise, and consisting of incomplete, measured PPA data lines and complete, reconstructed PPA data lines, and wherein an MR image of the subject is electronically reconstructed from the k-space data of said reception channels using a PPA reconstruction algorithm, which is at least subsequently displayed on a display screen the improvement comprising the steps of, for each reception channel:

selecting a region of k-space containing respective portions of some of said incomplete, measured PPA data lines and respective portions of some of said complete, reconstructed PPA data lines;

for each PPA data line in said region, identifying a level of said noise therein;

for a selected reconstructed, complete PPA data line in said region, automatically electronically calculating a scaling factor dependent on the noise level in the selected reconstructed, complete PPA data line and the noise level in at least one of said incomplete, measured PPA data lines in said region;

applying said scaling factor to the selected reconstructed, complete PPA data line to scale a contribution of said selected reconstructed, complete data line within said reconstructed MR image of said subject generated by said PPA reconstruction algorithm and displaying the scaled reconstructed MR image which is at least subsequently displayed on a display screen.

2. The improvement of claim 1 comprising automatically limiting said scaling factor dependent on a location of the selected region in k-space.

3. The improvement of claim 2 wherein k-space has a center and peripheral edges, and comprising employing a higher limit for said scaling factor when said region is selected closer to said center of k-space than from any of said peripheral edges.

4. The improvement of claim 1 wherein each of said data lines is comprised of a plurality of samples, and wherein the step of identifying a level of said noise for each of said PPA data lines in said region comprises identifying an average energy of the samples in each of the respective portions of said PPA data lines in said region.

5. The improvement of claim 4 wherein the step of automatically electronically calculating said scaling factor comprises automatically calculating said scaling factor dependent on a ratio of the average energy content of said samples in said portion of said selected reconstructed complete PPA data line to the average energy content of said samples in said portion of said at least one of said measured, incomplete PPA data lines in said region.

6. The improvement of claim 5 wherein the step of automatically electronically calculating said scaling factor further comprises using an exponential power of said ratio.

7. The improvement of claim 6 comprising automatically limiting said scaling factor dependent on a location of the selected region in k-space.

8. The improvement of claim 7 wherein k-space has a center and peripheral edges, and comprising employing a higher limit for said scaling factor when said region is selected closer to said center of k-space than from any of said peripheral edges.

9. In a magnetic resonance (MR) imaging apparatus comprising a plurality of reception channels configured to interact with the subject and respectively acquire data that are electronically stored as k-space data for each reception channel according to a partial parallel acquisition (PPA) technique, said k-space data, for each reception channel, comprising a plurality of PPA data lines, each containing noise, and consisting of incomplete, measured PPA data lines and complete, reconstructed data lines, and an MR image reconstruction computer that executes a PPA reconstruction algorithm in order to reconstruct an MR image of the subject from the k-space data of said reception channels which is at least subsequently displayed on a display screen, the improvement of said MR image reconstruction computer being that the MR image reconstruction computer is programmed to:

select a region of k-space containing respective portions of some of said incomplete, measured PPA data lines and respective portions of some of said complete, reconstructed PPA data lines;

for each PPA data line in said region, identify a level of said noise therein;

for a selected reconstructed, complete PPA data line in said region, automatically electronically calculate a scaling factor dependent on the noise level in the selected reconstructed, complete PPA data line and the noise level in at least one of said incomplete, measured PPA data lines in said region;

apply said scaling factor to the selected reconstructed, complete PPA data line In order to scale a contribution of said selected reconstructed, complete PPA data line to said MR image of said subject in said PPA reconstruction algorithm and reconstruct the MR image of the subject which is at least subsequently displayed on a display screen.

10. The improvement of claim 9 wherein said image reconstruction computer is further programmed in order to automatically limit said scaling factor dependent on a location of the selected region in k-space.

11. The improvement of claim 10 wherein k-space has a center and peripheral edges, and wherein said image reconstruction computer is further programmed in order to employ a higher limit for said scaling factor when region is selected closer to said center of k-space than from any of said peripheral edges.

12. The improvement of claim 11 wherein each of said PPA data lines is comprised of a plurality of samples, wherein said image reconstruction computer is further programmed in order to identify an average energy of the samples in each of the respective portions of said PPA data lines in said region as said level of noise therein.

13. The improvement of claim 12 wherein said image reconstruction computer is further programmed in order to automatically electronically calculate said scaling factor by automatically calculating said scaling factor dependent on a ratio of the average energy content of said samples in said portion of said selected reconstructed complete PPA data line to the average energy content of said samples in said portion of said at least one of said measured, incomplete PPA data lines in said region.

14. The improvement of claim 13 wherein said image reconstruction computer is further programmed in order to automatically electronically calculate said scaling factor further comprises automatically electronically calculating said scaling factor using an exponential power of said ratio.

15. The improvement of claim 14 wherein said image reconstruction computer is further programmed in order to automatically limit said scaling factor dependent on a location of the selected region in k-space.

16. The improvement of claim 15 wherein k-space has a center and peripheral edges, and wherein said image reconstruction computer is further programmed in order to employ a higher limit for said scaling factor when said region is selected closer to said center of k-space than from any of said peripheral edges.

* * * * *